United States Patent [19]
Hong

[11] Patent Number: 5,414,287
[45] Date of Patent: May 9, 1995

[54] PROCESS FOR HIGH DENSITY SPLIT-GATE MEMORY CELL FOR FLASH OR EPROM

[75] Inventor: Gary Hong, Hsin-Chu, Taiwan, Prov. of China

[73] Assignee: United Microelectronics Corporation, HsinChu, Taiwan, Prov. of China

[21] Appl. No.: 231,812

[22] Filed: Apr. 25, 1994

[51] Int. Cl.⁶ ................. H01L 29/68; H01L 21/265
[52] U.S. Cl. .................... 257/316; 257/322; 257/324; 257/328; 257/330; 257/331; 437/42; 437/43; 437/228
[58] Field of Search ............... 257/316, 322, 324, 328, 257/330, 331; 437/43, 42, 228

[56] References Cited

U.S. PATENT DOCUMENTS

| | | | |
|---|---|---|---|
| 4,868,629 | 9/1989 | Eitan | 365/185 |
| 5,017,977 | 5/1991 | Richardson | 257/316 |
| 5,063,172 | 11/1991 | Manley | 437/43 |
| 5,115,288 | 5/1992 | Manley | 357/23.5 |

OTHER PUBLICATIONS

"High Performance CMOS Surrounding Gate Transistor (SGT) for Ultra High Density LSIS", by H. Takato et al., IEDM 88, pp. 222–224, Jan. 1988.

*Primary Examiner*—Edward Wojciechowicz
*Attorney, Agent, or Firm*—George O. Saile

[57] ABSTRACT

A method and structure for manufacturing a high-density split gate memory cell, for a flash memory or EPROM, is described. Silicon islands are formed from a silicon substrate implanted with a first conductivity-imparting dopant. A first dielectric layer surrounds the vertical surfaces of the silicon islands, whereby the first dielectric layer is a gate oxide. A first conductive layer is formed over a portion of the vertical surfaces of the first dielectric layer, and acts as a floating gate for the high density split-gate memory cell. A source region is located in the silicon substrate, and is implanted with a second and opposite conductivity-imparting dopant to the first conductivity-imparting dopant, and surrounds the base of the silicon islands. A drain region is located in the top of the silicon islands, and is also implanted with a second and opposite conductivity-imparting dopant to the first conductivity-imparting dopant. A second dielectric layer is formed over the top and side surfaces of the floating gate, and acts as an interpoly dielectric. A second conductive layer is formed over that remaining portion of the vertical surfaces of the first dielectric layer not covered by the first conductive layer, and surrounds the second dielectric layer, whereby the second conductive layer is a control gate.

21 Claims, 5 Drawing Sheets

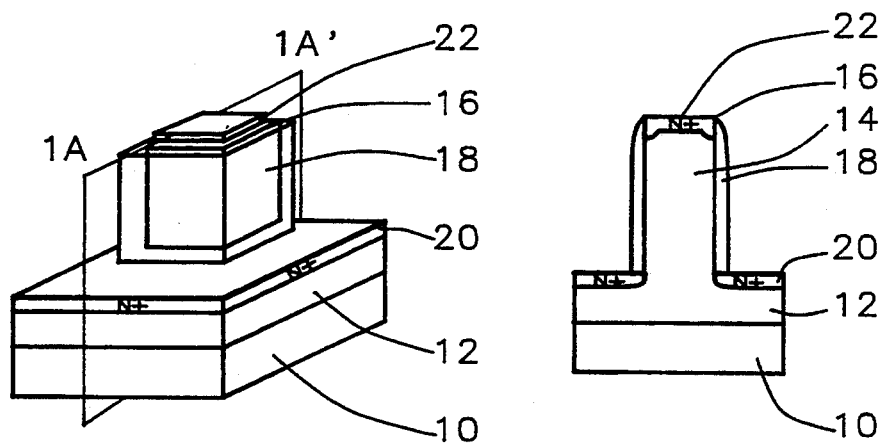
FIG. 1 – Prior Art    FIG. 1A – Prior Art
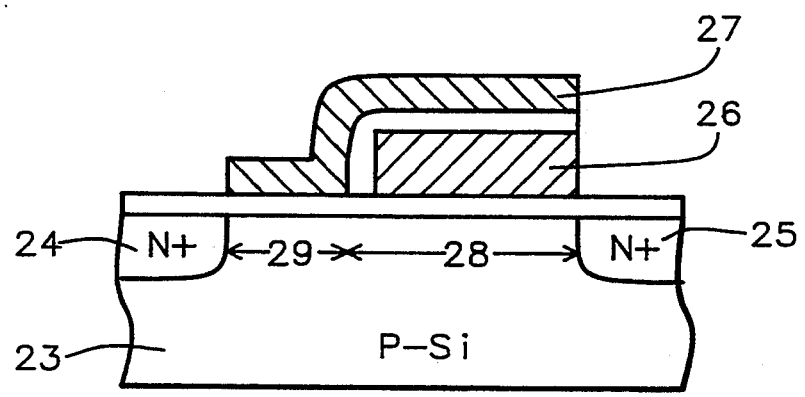
FIG. 2 – Prior Art

PROCESS FOR HIGH DENSITY SPLIT-GATE MEMORY CELL FOR FLASH OR EPROM

RELATED PATENT APPLICATION

Ser. No. 08/231811, filed Apr. 25, 1994, (UMC2-93-090), "Process for High Density Flash EPROM Cell", inventor Gary Hong.

BACKGROUND OF THE INVENTION (1) Field of the Invention

This invention relates to a Read Only Memory (ROM) semiconductor device, and more particularly to a method and structure of manufacturing a high-density split gate memory cell for a flash memory or EPROM (Erasable Programmable Read Only Memory).

(2) Description of the Related Art

ROM devices are well known and widely used in the computer technology. In general, a ROM device consists of an array of MOSFETs (Metal Oxide Semiconductor Field Effect Transistor) arranged in columns and rows where selected MOSFETs are rendered permanently conductive, or non-conductive, depending on the type of transistor. The ability to set the conductive state of each MOSFET provides a means for storing binary information, and is done typically during a manufacturing process. In a ROM device, this information is non-volatile, i.e., it is maintained even when power is removed from the circuit.

EPROM devices differ from ROMs in their ability to be programmed and erased by a user, after the manufacturing process is complete. They offer advantages such as a small single-cell structure, made of a single MOS transistor with a double-polysilicon gate, and thus high density. Programming is typically accomplished by channel hot-electron injection, outside of the circuit in which the EPROM is used, and erasing by exposure to ultraviolet light, or other means. These somewhat cumbersome techniques explain the popularity of EEPROMs (Electrically Erasable Programmable Read Only Memory), which can be erased and programmed while in-circuit, using Fowler-Nordhiem tunneling. However, EEPROMs have a large cell size and require two transistors per cell.

An EEPROM uses a floating gate structure in the MOSFET cell to provide programmability. The floating, or unconnected, gate provides a conductive surface isolated from the source and drain regions of the MOSFET by a thin gate oxide. A second conductive gate, called the control gate, is adjacent to but isolated from the floating gate. The threshold voltage characteristics of the MOSFET cell is controlled by the amount of charge on the floating gate. The amount of charge is set to one of two levels, to indicate whether the cell has been programmed "on" or "off".

The memory cell's state is "read" by applying appropriate voltages to the MOSFET source and drain, and to the control gate, and then sensing the amount of current flow through the transistor. The desired memory cell is selected by choosing the source and drain lines in the column where the cell is located, and applying the control gate voltage to the control gates in the row of the cell being addressed.

The memory cell's programmable state may be erased by removing charge from the floating gate. A fairly recent technology is "flash" memories, in which the entire array of memory cells, or a significant subset thereof, is erased simultaneously.

A known problem with the EEPROM is that of "over-erasing", in which positive charge remains on the floating gate after an erase. One solution is the split-gate structure of FIG. 2, which solves the over-erase problem but at the expense of a larger cell size. Source 24 and drain 25 regions are self-aligned in a substrate 23 with the edges of floating-gate 26 and isolation gate 27, which have channel lengths 28 and 29, respectively. An example is shown in U.S. Pat. No. 4,868,629 (Eitan). Eitan teaches the use of a photoresist pattern to cover part of the floating gate area and the channel region of the "isolation transistor" (which is connected in series with the floating-gate transistor), during source/drain implant. There are two problems associated with this method for making a split-gate Flash cell. First, consistency of the total channel length of the cell—floating gate plus isolation gate —cannot be easily controlled, since it is dependent on photolithography alignment and CD (Critical Dimension) loss. Second, the total channel length (and thus the cell size) tends to be larger due to the same photolithography process limitation.

A second split-gate structure is shown in U.S. Pat. No. 5,115,288 (Manley). A polysilicon spacer is utilized to form a self-aligned channel for the isolation transistor, and thus produce a constant total channel-length for the entire cell. However, this process requires an extra polysilicon layer (three, instead of two layers), and a critical photoresist masking step is required which uses resist to cover half of the floating gate for removing a poly spacer on one side.

Since two transistors are connected in series for the split-gate Flash memory cells described above, a larger cell size than for a single-transistor Flash cell will result.

In the semiconductor technologies, and particularly in memory structures, there is a constant effort to reduce the lateral size of each device, thus allowing increased density of devices on the same or similar size semiconductor chip. One approach to reducing the lateral area of the device is to build a more vertical structure, as is shown in "High Performance CMOS Surrounding Gate Transistor (SGT) for Ultra High Density LSIs", by H. Takato et al, IEDM 88 pages 222-224. As shown in FIGS. 1 and 1A (in which FIG. 1A is a cross-section along line 1A-1A' of FIG. 1), a vertical "silicon island" 14 is formed from a p-well region 12 formed over a silicon substrate 10. The sidewalls of the island are utilized as the channel region of the device, and the conductive gate layer 18 is formed surrounding the sidewalls and separated therefrom by a thin gate oxide 16. The source 20 and drain 22 regions are formed in horizontal regions around the base of, and in the top of, respectively, the silicon island.

SUMMARY OF THE INVENTION

It is therefore an object of the invention to provide a high density split-gate memory cell, for use in an electrically programmable read-only memory (EPROM) or flash-memory.

It is a further object of the invention to provide a method for manufacturing a high density split-gate memory cell, for an electrically programmable read-only memory (EPROM) or flash-memory, using a easily-manufactured two-poly process.

It is a further object of the invention to provide a structure and method of producing a high density split-gate memory cell in which the total channel length, and the channel length of each of two transistors, is accurately and easily controlled.

These objects are achieved by a structure having silicon islands formed from a silicon substrate implanted with a first conductivity-imparting dopant. A first dielectric layer surrounds the vertical surfaces of the silicon islands, whereby the first dielectric layer is a gate oxide. A first conductive layer is formed over a portion of the vertical surfaces of the first dielectric layer, and acts as a floating gate for the high density split-gate memory cell. A source region is located in the silicon substrate, and is implanted with a second and opposite conductivity-imparting dopant to the first conductivity-imparting dopant, and surrounds the base of the silicon islands. A drain region is located in the top of the silicon islands, and is also implanted with a second and opposite conductivity-imparting dopant to the first conductivity-imparting dopant. A second dielectric layer is formed over the top and side surfaces of the floating gate, and acts as an interpoly dielectric. A second conductive layer is formed over that remaining portion of the vertical surfaces of the first dielectric layer not covered by the first conductive layer, and surrounds the second dielectric layer, whereby the second conductive layer is a control gate.

These objects are further achieved by a method of manufacturing in which silicon islands are formed from a silicon substrate implanted with a first conductivity-imparting dopant. Source regions are formed in the silicon substrate in the regions between the silicon islands, by implanting with a second and opposite conductivity-imparting dopant to the first conductivity-imparting dopant, and simultaneously drain regions are formed in the top of the silicon islands by the implanting with a second and opposite conductivity-imparting dopant. A first dielectric layer is formed surrounding vertical surfaces of the silicon islands. A first conductive layer is formed over a portion of the vertical surfaces of the first dielectric layer, thereby creating a floating gate for the high density split-gate memory cell. A second dielectric layer is formed over the top and side surfaces of the floating gate. A second conductive layer is formed over that remaining portion of the vertical surfaces of the first dielectric layer not covered by the first conductive layer, and surrounding the second dielectric layer, whereby the second conductive layer is a control gate.

BRIEF DESCRIPTION OF THE DRAWINGS

FIGS. 1 and 1A are a three-dimensional view and cross-sectional view (taken along line 1 A–1 A' of FIG. 1), respectively, of a surrounding-gate CMOS device of the prior art.

FIG. 2 is a cross-sectional view of a Prior Art split-gate Flash memory cell.

DESCRIPTION OF THE PREFERRED EMBODIMENTS

Figure 3:
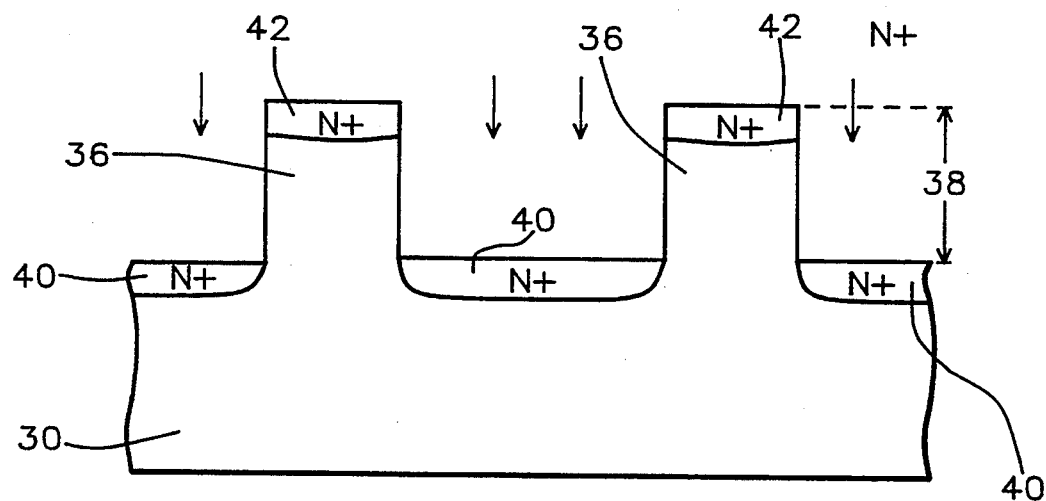
FIGS. 3, 4 and 5 are cross-sectional views at different process steps for the high density split-gate memory cell of the invention.

Referring now to the drawings, more particularly to FIGS. 3 through 8, there is illustrated a method and resulting structure for the novel process for producing a high density split-gate memory cell for a flash memory or EPROM device. Referring more particularly to FIG. 3, there is illustrated a silicon substrate 30 which has been p-doped by ion-implanting with boron at an energy of between about 50 and 300 KeV., and a concentration of between about $5 \times 10^{11}$ and $1 \times 10^{13}$ atoms/cm$^2$. An anisotropic etch is performed to form silicon islands 36, which have a height 38 of between about 0.5 and 2.0 micrometers. The height of the silicon islands determines the total channel length of the memory cell to be subsequently formed. The dry etch rate by current integrated circuit technology is quite constant and well-controlled, and so greater control can be exercised over the total channel length than in the prior art processes for split-gate EPROMs which are dependent on photolithography processes. The source regions 40 and drain regions 42 are formed by ion implantation of arsenic AS 75 at an energy of between about 30 and 100 KeV, and a concentration of between about $1 \times 10^{15}$ and $8 \times 10^{15}$ atoms/cm$^2$.

Figure 4:
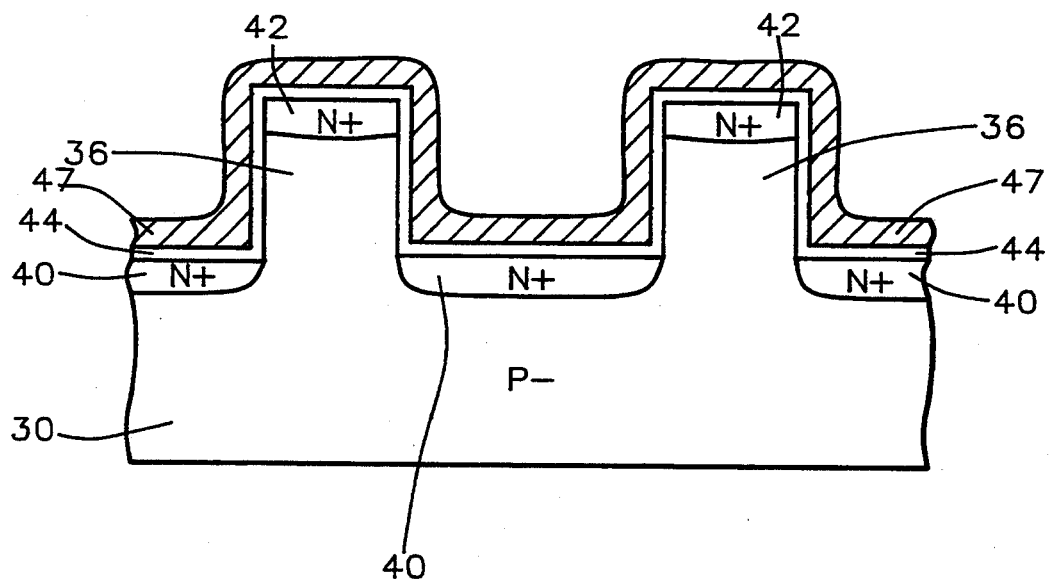

Referring now to FIG. 4, an oxide layer is formed to provide a gate oxide 44 on the vertical sides of silicon islands 36, and on the horizontal surfaces of the memory cell. This oxidation is performed by thermal oxidation at a temperature of between about 800° and 900° C. in dry 02 (oxygen) to form an oxide layer with a thickness of between about 50 and 120 Angstroms.

A conformal deposition of polycrystalline silicon (polysilicon) 47, is now performed to a thickness of between about 500 and 2000 Angstroms, by Low Pressure Chemical Vapor Deposition (LPCVD). The resistivity of the polysilicon layer is reduced by doping with POC13 (phosphorus oxychloride) at between about 800° and 950 ° C. for between about 10 and 20 minutes, to reduce the sheet resistance to between about 30 and 1000 ohms/square. This completes the structure shown in FIG. 4.

Figure 5:
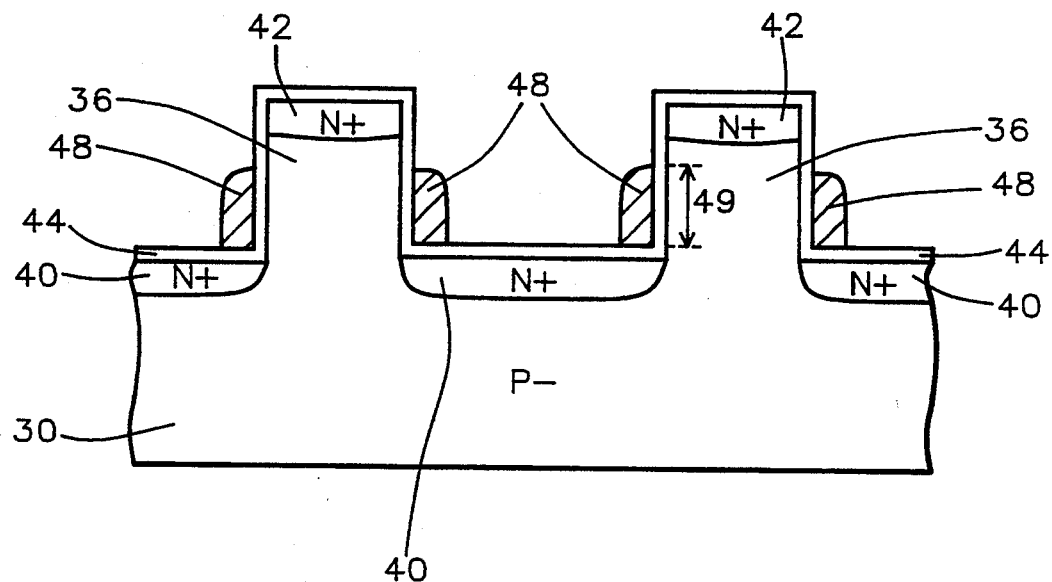

In a critical step of the invention, with reference to FIG. 5, the polysilicon layer 47 is overetched to form partial poly spacers 48. This etch is a dry etch process at a pressure of about 400 mtorr, a power of about 300 watts, using He (Helium) at about 400 cc./min., C12 at about 200 cc./min., and HBr (hydrogen bromide) at about 100 cc./min., with end point detector as an etch completeness reference. Additionally, a timed overetch is performed for between about 50 and 300 seconds. Poly spacers 48 will form the floating gate of the split-gate memory cell, and the height 49 as determined by the overetch determines the channel-length of the floating-gate transistor. Using an overetch provides excellent control of the floating-gate channel length and is not affected by lithography or alignment limitations.

Figure 6:
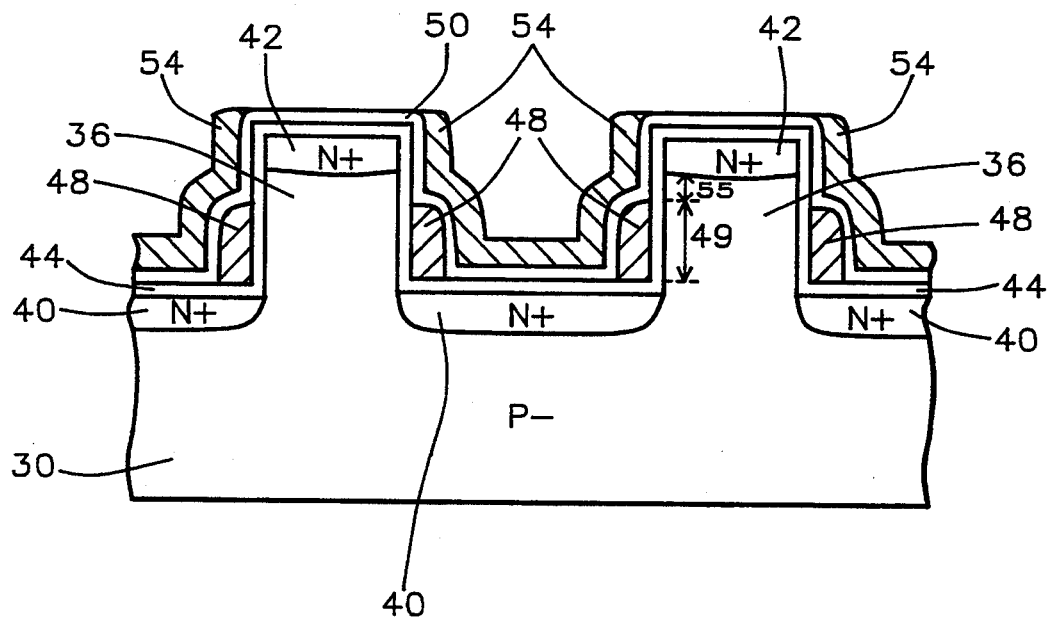
FIG. 6 is a cross-sectional view along line 6—6 of FIG. 8 for the high density split-gate memory cell of the invention.

With reference to FIG. 6, Interpoly oxide 50 is now formed, to a thickness of between about 150 and 300 Angstroms. This layer may be a single oxide layer, as shown in FIG. 5, or a combination oxide/nitride, or, preferably, an oxide/nitride/oxide (ONO) structure. To form the ONO structure (not shown), subsequent layers of silicon oxide (SiO2), silicon nitride (Si3N4) and silicon oxide (SiO2) are formed. The first SiO2 layer is formed by thermal oxidation to a thickness of between about 50 and 150 Angstroms. The Si3N4 layer is deposited by LPCVD to a thickness of between about 60 and 200 Angstroms. The final SiO2 layer is formed by thermal oxidation, or LPCVD, to a thickness of between about 30 and 100 Angstroms.

A second polysilicon layer 54 is now deposited, by LPCVD, to form a layer with a thickness of between about 2000 and 4000 Angstroms. Doping is accomplished by ion implantation with arsenic or phosphorus, at a concentration of about $1 \times 10^{16}$ atoms/cm$^2$ and an energy of about 50 KeV, or by doping with POCL3, as described above.

An anisotropic etch is performed on this polysilicon layer to form the word lines 54 of the EPROM device. This can be seen more clearly in the top view of FIG. 8, in which it can be seen that word line 54 connects a column of cells including the two memory cells of FIG. 6 along the line 6—6. Using conventional lithography and etching, polysilicon is removed from between adjacent word lines, and from the top of silicon islands 36, as shown in FIG. 6, to form word line 54. Word line 54 also forms the control gate for the Flash memory cells. The length 55 of the control gate directly adjacent to silicon islands 36 is the channel length of the isolation transistor, which is also controlled by the overetch of the partial poly spacer 48.

Figure 7:
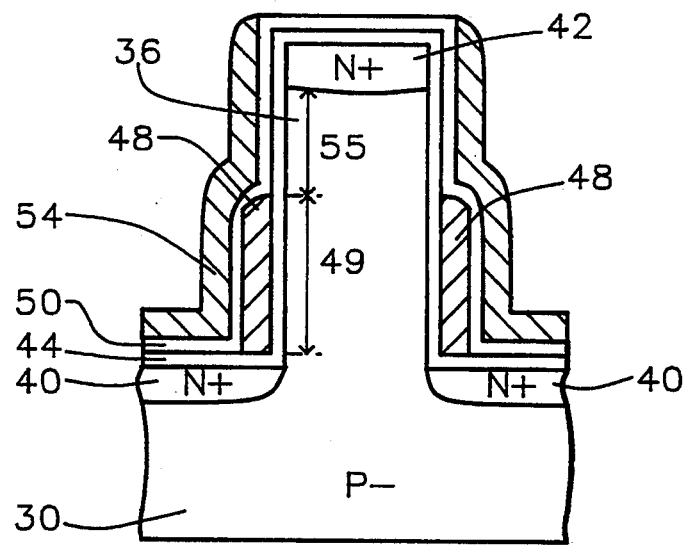
FIG. 7 is a cross-sectional view along line 7—7 of FIG. 8 for the high density split-gate memory cell of the invention.
Figure 8:
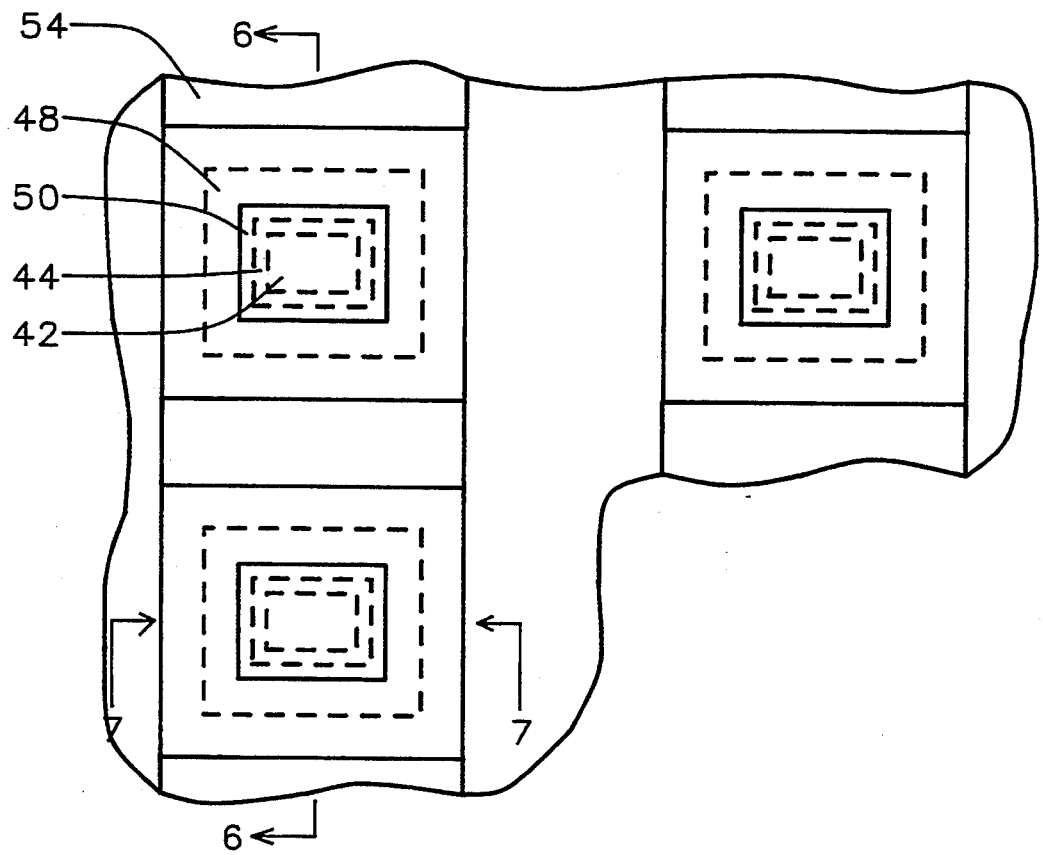
FIG. 8 is a top view of the high density split-gate memory cell of the invention.

FIGS. 7 and 8 are different views of the completed cell structure. FIG. 8 is a top view, in which the structure shown along line 6—6 is that shown in FIG. 6, while the view along line 7—7 is the FIG. 7 structure. FIG. 7 elements are numbered to correspond to the same reference numbers as in FIG. 6.

Figure 9:
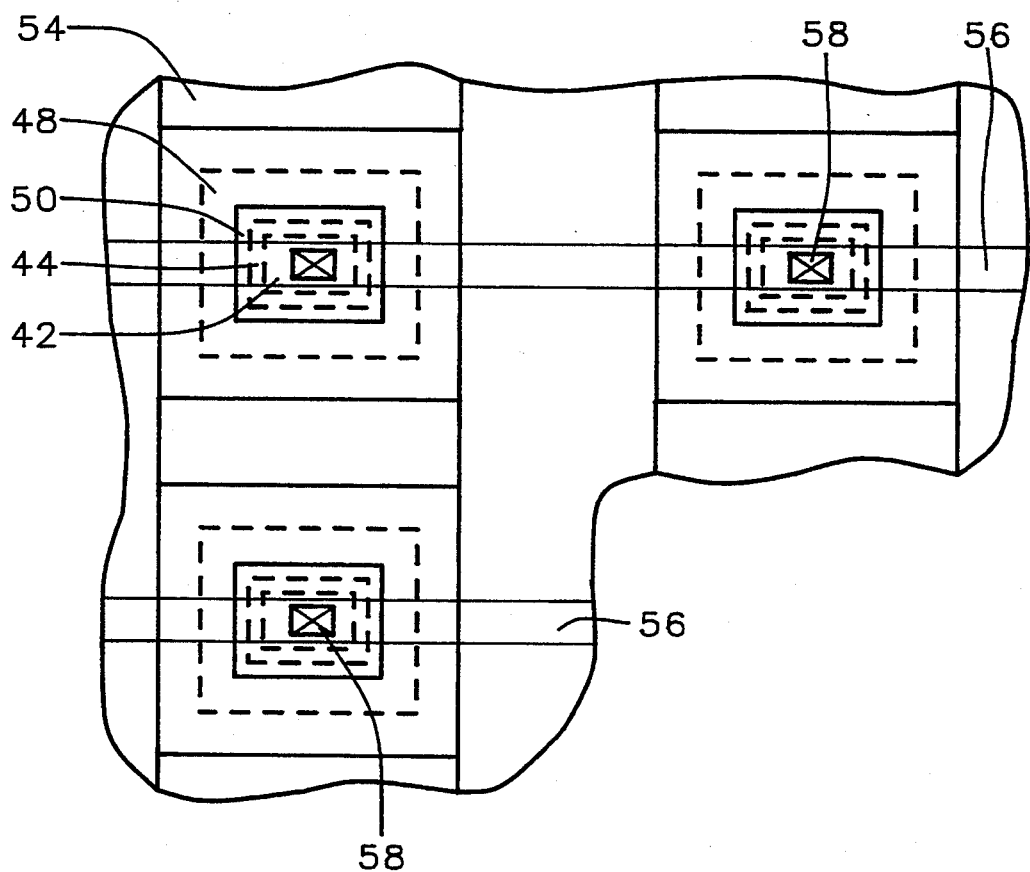
FIG. 9 is a top view of the high density split-gate memory cell of the invention, after metallization and formation of bit lines.

Completion of the EPROM device (not shown) now proceeds as is well known in the art. The second polysilicon layer 54 is thermally oxidized to form a dielectric layer, followed by deposition of borophosphosilicate glass (BPSG), BPSG reflow to planarize its top surface, contact formation, and metallization. Referring to FIG. 9, bit lines 56 are shown and are formed of metal lines during metallization, and contact the drain regions 42 at the top of the silicon islands by contacts 58.

Operation of the EPROM is indicated in Table I below. To program the EPROM, that is, to set the charge on the floating gate to an "off" level, a voltage level of 12–15 volts (V) is applied to the word line of the memory cell that is desired to be programmed. A level of 6 V is applied to the memory cell drain, and 0 V to the source, so that electrons are injected into the floating gate by hot electrons from the drain area.

When it is desired to read the contents of a memory cell, a level of 3 V is applied to the word line (W/L), 1 V to the drain, and 0 V to the source. When there is charge on the floating gate, i.e., the cell is programmed, the threshold voltage VT is high (>5 V) and the cell is read as being "off". If the cell is unprogrammed, VT is low (between about 0.7 and 1.5 V) and large cell current is read (between about 50 and 200 microamps) and the cell is read as being "on". Large cell current is one of the advantages of the invention using the surrounding cell structure.

To erase the cell contents, 0 V is applied at the word line, the drain is left to "float", that is, as if unconnected, and the source is set to 12 V. The entire array, or a large sector of the array, is erased at the same time, for a "flash" memory.

TABLE I

| Operation | Control gate (W/L) | Drain | Source |
|---|---|---|---|
| Program | 12–15 V | 6 V | 0 |
| Erase | 0 | floating | 12 V |
| Read | 3 V | 1 V | 0 |

The source regions are connected together on the bottom area of the memory cell, unless separate source areas are desired for sector erase operations. The source area is large so that contact to the source (not shown) is not critical and can be anywhere on the array.

The advantages of the invention include the higher density made possible by the surrounding gate structure, which reduces the area of each memory cell. And the controllability of the channel-lengths of the two transistors in each cell is enhanced, since these lengths are determined by a well-controlled anisotropic etch rather than by photolithography.

While the invention has been particularly shown and described with reference to the preferred embodiments thereof, it will be understood by those skilled in the art that various changes in form and details may be made without departing from the spirit and scope of the invention.

What is claimed is:

1. A high density split-gate memory cell, for an erasable programmable read-only memory (EPROM) or flash-memory, comprising:
    a silicon island formed from a silicon substrate implanted with a first conductivity-imparting dopant;
    a first dielectric layer surrounding vertical surfaces of said silicon islands, whereby said first dielectric layer is a gate oxide;
    a first conductive layer formed over a portion of the vertical surfaces of said first dielectric layer, acting as a floating gate for said high density split-gate memory cell;
    a source region in said silicon substrate, implanted with a second and opposite conductivity-imparting dopant to said first conductivity-imparting dopant, surrounding the base of said silicon island;
    a drain region in the top of said silicon island, implanted with a second and opposite conductivity-imparting dopant to said first conductivity-imparting dopant;
    a channel region between said source and drain regions, under the vertical surfaces of said silicon island, whereby said floating gate is coupled to only a first lower portion of said channel region;
    a second dielectric layer over the top and side surfaces of said floating gate, acting as an interpoly dielectric; and
    a second conductive layer formed over that remaining portion of said vertical surfaces of said first dielectric layer not covered by said first conductive layer, and surrounding said second dielectric layer, coupled to that portion of said channel region not coupled to said floating gate, whereby said second conductive layer is a control gate.

2. The high density split-gate memory cell of claim 1, wherein said silicon island has a height of between about 0.5 and 2.0 micrometers.

3. The high density split-gate memory cell of claim 1, wherein said gate oxide has a thickness of between about 50 and 120 Angstroms.

4. The high density split-gate memory cell of claim 1, wherein said first conductive layer is doped polycrystalline silicon having a thickness of between about 500 and 2000 Angstroms.

5. The high density split-gate memory cell of claim 1, wherein said source and drain regions are ion implanted with arsenic at a concentration of between about $1 \times 10^{15}$ and $8 \times 10^{15}$ atoms/cm.$^2$ and an energy of between about 30 and 100 KeV.

6. The high density split-gate memory cell of claim 1, wherein said interpoly dielectric comprises:
 a first layer of silicon oxide, adjacent to said first conductive layer;
 a layer of silicon nitride, over said first layer of silicon oxide; and
 a second layer of silicon oxide, over said layer of silicon nitride.

7. The high density split-gate memory cell of claim 1, wherein said second conductive layer is formed of doped polycrystalline silicon, and has a thickness of between about 2000 and 4000 Angstroms.

8. A method of forming a high density split-gate memory cell, for an electrically programmable read-only memory (EPROM) or flash-memory, comprising the steps of:
 forming silicon islands from a silicon substrate implanted with a first conductivity-imparting dopant;
 forming source regions in said silicon substrate in the regions between said silicon islands, by implanting with a second and opposite conductivity-imparting dopant to said first conductivity-imparting dopant, and simultaneously forming drain regions in the top of said silicon islands by said implanting with a second and opposite conductivity-imparting dopant;
 forming a first dielectric layer surrounding vertical surfaces of said silicon islands;
 forming a first conductive layer over a portion of the vertical surfaces of said first dielectric layer, thereby creating a floating gate for said high density split-gate memory cell;
 forming a second dielectric layer over the top and side surfaces of said floating gate; and
 forming a second conductive layer over that remaining portion of said vertical surfaces of said first dielectric layer not covered by said first conductive layer, and surrounding said second dielectric layer, whereby said second conductive layer is a control gate.

9. The method of claim 8 wherein said forming a first conductive layer comprises the steps of:
 depositing a layer of polycrystalline silicon over said first dielectric layer to a thickness of between about 500 and 2000 Angstroms;
 doping said layer of polycrystalline silicon by doping with phosphorus oxychloride (POCl3) at between about 800 and 950° C. for between about 10 and 20 minutes, to reduce the sheet resistance to between about 30 and 1000 ohms/square;
 etching said layer of polycrystalline silicon by anisotropically etching at a pressure of about 400 mtorr, a power of about 300 watts, using Helium (He) at about 400 cc./min., chlorine (Cl2) at about 200 cc./min., and hydrogen bromide (HBr) at about 100 cc./min., with end point detector as an etch completeness reference; and overetching said layer of polycrystalline silicon for between about 50 and 300 seconds, such that said layer of polycrystalline silicon covers said portion of the vertical surfaces of said first dielectric layer.

10. The method of claim 8 wherein said first dielectric layer is formed to a thickness of between about 50 and 120 Angstroms, by thermal oxidation, at a temperature of between about 800° and 900° C., in dry oxygen.

11. The method of claim 8, wherein said silicon island is formed to a height of between about 0.5 and 2.0 micrometers.

12. The method of claim 8, wherein said source and drain regions are ion implanted with arsenic at a concentration of between about $1 \times 10^{15}$ and $8 \times 10^{15}$ atoms/cm.$^2$ and an energy of between about 30 and 100 KeV.

13. The method of claim 8, wherein said forming a second dielectric layer comprises the steps of:
 forming a first layer of silicon oxide, adjacent to said first conductive layer and over the exposed surfaces of said first dielectric layer, to a thickness of between about 50 and 150 Angstroms;
 forming a layer of silicon nitride, over said first layer of silicon oxide, to a thickness of between about 60 and 200 Angstroms;
 forming a second layer of silicon oxide, over said layer of silicon nitride, to a thickness of between about 30 and 100 Angstroms; and 14. The method of claim 8, wherein said second conductive layer is formed of doped polycrystalline silicon, and is formed to a thickness of between about 2000 and 4000 Angstroms.

15. An electrically programmable read-only memory (EPROM) or flash-memory, with an array of high density split-gate memory cells, comprising:
 silicon islands formed from a silicon substrate having been implanted with a first conductivity-imparting dopant;
 a first dielectric layer surrounding vertical surfaces of said silicon islands, whereby said first dielectric layer is a gate oxide;
 a first conductive layer formed over a portion of the vertical surfaces of said first dielectric layer, acting as floating gates for said high density split-gate memory cells;
 source regions in said silicon substrate, implanted with a second and opposite conductivity-imparting dopant to said first conductivity-imparting dopant, surrounding the base of said silicon islands;
 drain regions in the top of said silicon islands, implanted with a second and opposite conductivity-imparting dopant to said first conductivity-imparting dopant;
 channel regions between said source and drain regions, under the vertical surfaces of said silicon islands, whereby said floating gate is coupled to only a first lower portion of said channel region;
 a second dielectric layer over the top and side surfaces of said floating gates, acting as an interpoly dielectric; and
 a second conductive layer formed over that remaining portion of said vertical surfaces of said first dielectric layer not covered by said first conductive layer, and surrounding said second dielectric layer, coupled to that portion of said channel region not coupled to said floating gate, whereby said second conductive layer acts as a control gate and word line for said high density split-gate memory cells, and connects together a column of said memory cells;
 a thermal oxide layer over said second conductive layer;

an insulating layer of borophosphosilicate glass over said memory cells and and said word lines;

16. The device of claim 15 wherein said providing means are used to program said memory cells by applying a voltage of between about 12 and 15 volts to said word line, a voltage of 6 volts to said drain region, and 0 volts to said source region.

17. The device of claim 15 wherein said providing means are used to erase said memory cells by applying a voltage of 0 volts to said word line, a floating voltage to said drain region, and a voltage of 12 volts to said source region.

18. The device of claim 15 wherein said providing means are used to read said memory cells by applying a voltage of 3 volts to said word line, a voltage of 1 volt to said drain region, and 0 volts to said source.

19. The device of claim 18 further comprising a means to detect current flow through said memory cells during said read operation.

20. The device of claim 19 wherein said detecting means are used to determine if said memory cell is off or on.

21. A high density split-gate memory cell, for an erasable programmable read-only memory (EPROM) or flash-memory, formed by the method comprising the steps of:

forming silicon islands from a silicon substrate implanted with a first conductivity-imparting dopant;

forming source regions in said silicon substrate in the regions between said silicon islands, by implanting with a second and opposite conductivity-imparting dopant to said first conductivity-imparting dopant, and simultaneously forming drain regions in the top of said silicon islands by said implanting with a second and opposite conductivity-imparting dopant;

forming a first dielectric layer surrounding vertical surfaces of said silicon islands;

forming a first conductive layer over a portion of the vertical surfaces of said first dielectric layer, thereby creating a floating gate for said high density split-gate memory cell;

forming a second dielectric layer over the top and side surfaces of said floating gate; and forming a second conductive layer over that remaining portion of said vertical surfaces of said first dielectric layer not covered by said first conductive layer, and surrounding said second dielectric layer, whereby said second conductive layer is a control gate.

* * * * *